United States Patent [19]

Harding et al.

[11] 4,310,901
[45] Jan. 12, 1982

[54] ADDRESS MAPPING FOR MEMORY

[75] Inventors: Phillip A. Harding, Palos Verdes Pennisula; Carlos F. Chong, Rancho Palos Verdes; Herman L. Pockell, Torrance, all of Calif.

[73] Assignee: Electronic Memories & Magnetics Corporation, Encino, Calif.

[21] Appl. No.: 47,279

[22] Filed: Jun. 11, 1979

[51] Int. Cl.³ .................... G11C 11/40; G11C 13/00
[52] U.S. Cl. ........................ 365/200; 371/8; 371/21
[58] Field of Search ............ 365/200; 371/10, 8, 371/21

[56] References Cited

U.S. PATENT DOCUMENTS

| | | | |
|---|---|---|---|
| 3,544,777 | 12/1970 | Winkler | 371/10 |
| 3,633,175 | 1/1972 | Harper | 371/10 |
| 4,058,851 | 11/1977 | Scheuneman | 371/10 |

*Primary Examiner*—Terrell W. Fears
*Attorney, Agent, or Firm*—Seymour A. Scholnick; Marvin H. Kleinberg

[57] ABSTRACT

In a large scale addressable memory which is addressed with an applied block and word address, an auxiliary memory stores word addresses of defective locations within each block of the main memory. Such defective location addresses are supplied by the auxiliary memory in response to the applied block address. A set of comparators compare the applied word address and the defective location word addresses and signal any match. The auxiliary memory also provides a substitute location address for each stored defective location address. When a match is found by a comparator, the corresponding substitute location address is provided to the main memory to access a substitute memory location, which is known to be good.

22 Claims, 5 Drawing Figures

ADDRESS MAPPING FOR MEMORY

BACKGROUND OF THE INVENTION

1. Field of the Invention

The present invention relates to large scale memories and, more particularly, to a memory system which automatically provides "good" memory location in response to any permitted address and a method therefor.

2. Description of the Prior Art

The creation of very large, addressable memories, often resulted, as an expected outcome of the production process, in defective regions which could not be used for the storage of information. Generally, with fairly large memories, it is either not possible or quite expensive and time consuming to attempt to repair such defects; and accordingly, to avoid the need for expensive repairs or for discarding a substantially "good" memory because of a few "bad" locations, various schemes have been proposed to correct the problem.

In order to utilize memories in which defects are randomly located throughout the memory, several approaches have been proposed. One such approach has required the use of a content addressable memory in which is stored all of the addresses which, upon an initial examination, have proven to be defective or "bad". A second, smaller memory is used to store "good" addresses which can then be substituted for the defective or "bad" ones.

In order to use such a scheme, a proposed address would be applied to the content addressable memory, which would then compare its contents to the applied address. If the address was not found within the memory, the address could be used to access the corresponding location in the main memory. If, however, a match were found, then the second memory would provide the substitute address which would be used to access a "good" location in the main memory.

The problem with a content addressable memory is its fairly slow speed and the large number of time-consuming sequential binary comparison steps that must be taken by it before presence or absence of a bad memory location is verified by it and a memory location is actually made available for the storage or retrieval of information.

Another approach has been a "hard-wired" approach in which an address, when applied to the memory, does not access the location normally represented by that address, but rather, the resulting energizing signals are applied to a substitute or different location, which is known to be good. This process required access to the addressing circuits and the reconnection of the address outputs to the new, otherwise unused locations.

In this approach, no time is lost during operation of the memory, although substantial time and expense is entailed in the rewiring process. Further, while a core memory may be rewired, although with difficulty, a semi-conductor memory presents special problems that make "hard-wiring" a less desirable alternative.

What is required is a simple, easily fabricated, large scale memory with an ancillary store that will supply substitute good locations for applied "bad" locations with a minimal delay in the actual access of the memory.

In creating a memory which can appear to the user as a perfect, defect-free memory, an analysis has been undertaken to determine, on a statistical basis, the probability of failures occurring in a memory of given size. For example, in one particular type of memory which was analyzed the probability of having one defective location in a thousand word memory is fairly high. However, the probability that there would be two defective locations is much lower and the probability of three defective locations occurring is quite small. The statistics will vary for different memories, but are believed to be generally similar for present day memories, such as core and semiconductor memories.

The probability of four defective locations existing in a thousand "word" block is generally so small, that it can be ignored for all practical purposes. Accordingly, a scheme that need accommodate no more than three defects per thousand words should lead to the acceptance of enough otherwise rejected memories such that the occasional memory with four defects per thousand words can be repaired or discarded without materially impacting overall production costs.

A memory built according to this concept would then only need an extra three addressable words per thousand words to accommodate all of the failures that could normally be expected to occur on a random, statistical basis. In a million word memory, this suggests that the provision or designation of three thousand "spare" words which are available for substitute addressing should dramatically increase the acceptable product yield. These spares can either be located in a concentrated area of the memory such as in three, thousand word increments or blocks, or can be distributed throughout the memory.

Further, and still dealing with the example of the million word memory, if the memory is subdivided into a thousand blocks of a thousand words each, then each word can be uniquely identified by a combination of twenty binary digits. Ten digits can specify the "block" and ten digits specify the word within the block.

Generally addressable memories are organized in gross or large increments such as the above described "blocks" and are subdivided within each gross increment or block into fine or small increments such as the above described "words". Each address then includes a gross portion or block address that identifies the larger increment and a fine portion or word address that identifies a small increment within the identified large increment.

In accordance with an underlying concept of the present invention, the gross or block address portion of an address simultaneously identifies a gross increment of the main memory and a corresponding fine increment of an auxiliary memory, which may, of course, be a special one of the gross increments of the main memory.

Further, the auxiliary memory can be subdivided into a first address file and a second address file. A gross or block address portion of an address then identifies a fine increment or word in each of the address files. Stored in the auxiliary memory in the first address file are the addresses of all fine increments of the main memory which contain defects or errors and, in the second address file, the addresses of substitute, fine increments of the main memory are stored, organized as described above.

In one preferred million word embodiment of the invention, an auxiliary memory is provided with the same number of "words" as there are accessible "blocks" in the memory with which it is associated. Each auxiliary memory word is capable of storing up to three addresses of defective locations within the block, which is the statistical expectation. Associated with each of the "defective" addresses, in the same "word", can be stored three substitute addresses, each corresponding to one of the defective addresses.

If the spare or substitute locations are in the same block as the defective words, each defective location address and corresponding substitute location address can comprise a 10 bit word segment. The corresponding defective and substitute addresses can be grouped together in 20 bit word segments, or all of the defective addresses can form one part of the word while the substitute addresses can be grouped together to form a second part of the word. Other memory schemes could be devised in which the substitute locations require either more or less bits to specify the address.

In a preferred embodiment, an additional pair of bits is stored in conjunction with the defective addresses to specify how many defective addresses are actually stored in the word. Obviously, if only one defective address is encountered in a block, then only the contents of that portion of the word representing the one defective address is of interest and the remaining bits, normally allocated to other defective addresses, can be ignored.

A plurality of comparators, in our example, three, are provided to simultaneously compare an applied address to the stored defective addresses of the word associated with the address block. The stored, defective addresses then are simultaneously compared with the applied address for a match. If a match is found, the part of the word containing the address of the corresponding, substitute location can be read out and applied to the addressing circuits so that the substitute, good location in the main memory can be accessed. Through the use of the extra bits, which signal the number of stored defective addresses that are present, only the appropriate number of comparators is energized and the remaining parts of the word, in which no addresses are stored, need not be considered.

In various embodiments, the auxiliary or address memory can either be a single memory or may be two, smaller memory units, one for the storage of defective address locations and the other for the storage of the substitute address locations.

The address files may be programmable, read-only memories (PROM) with a plurality of words, each corresponding to a different block of the main memory. The second address file may be similar PROM or may be a part of the same PROM. Each PROM word of the second file can correspond to a PROM word in the first file to store a replacement address to correspond to each stored address which designates a "bad" location.

If the alternative or spare locations are not distributed at random throughout the memory but are located either in the same block as the defective address location or in predetermined, otherwise unused blocks of the memory, then the addresses stored in the second file need not include the entire address of the alternative location. If each block includes "spare addresses", the block portion of the address neet not be repeated. Similarly, if entire blocks are set aside for alternative locations, each comparator can be assigned to a block and the block address can be generated separately by a permanent, address generator. The PROM memory then need only store the bits specifying a particular location within that block.

In operation, when any applied address corresponds to a "bad" storage location, a substitute address is generated in its place, and is applied to the memory, without the user being aware of the substitution. No special modification of the memory is needed, other than the provision of sufficient "spare" locations within the memory.

According to the present invention, the address files, in which the defective address locations and substitute address locations are stored, can be created upon the initial testing of the main memory. In a first embodiment, a pair of programmable, read only memories (PROMS) are provided to store addresses that are to be used in conjunction with the memory.

Initially, the main memory is tested, location by location, with test apparatus capable of signalling errors or defects. These signals can be used to cause an address to be written in the first address file. A counter may keep track of the defects as they are found.

At the conclusion of the test of an individual block, the addresses in which the defects have been found are recorded in the PROM, and the counter output, representing the number of defects found, is also written into the PROM word. In general, if more than three defects are noted in a thousand word block, the counter can signal that the block is "defective" and may require "rework" or rejection.

When the entire memory had been tested and all of the defective locations identified, the addresses of locations in the main memory designated as "spares" which are not normally utilized are then loaded into the second address file. Thus, each defective location address in the first file, has a counterpart or "spare" or substitute address stored in the second file.

When the memory testing cycle is completed, the two address files will have been created. In subsequent use and operation of the memory, all addresses may be accepted. However, only those which correspond to "good" locations are actually used to access the location. Those addresses which represent defective or "bad" locations are recognized, and substitute addresses are applied to the memory, thereby furnishing a substitute "good" location without any additional time being required.

The novel features which are believed to be characteristic of the invention, both as to organization and method of operation, together with further objects and advantages thereof will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

DESCRIPTION OF THE PREFERRED EMBODIMENTS

Figure 1:
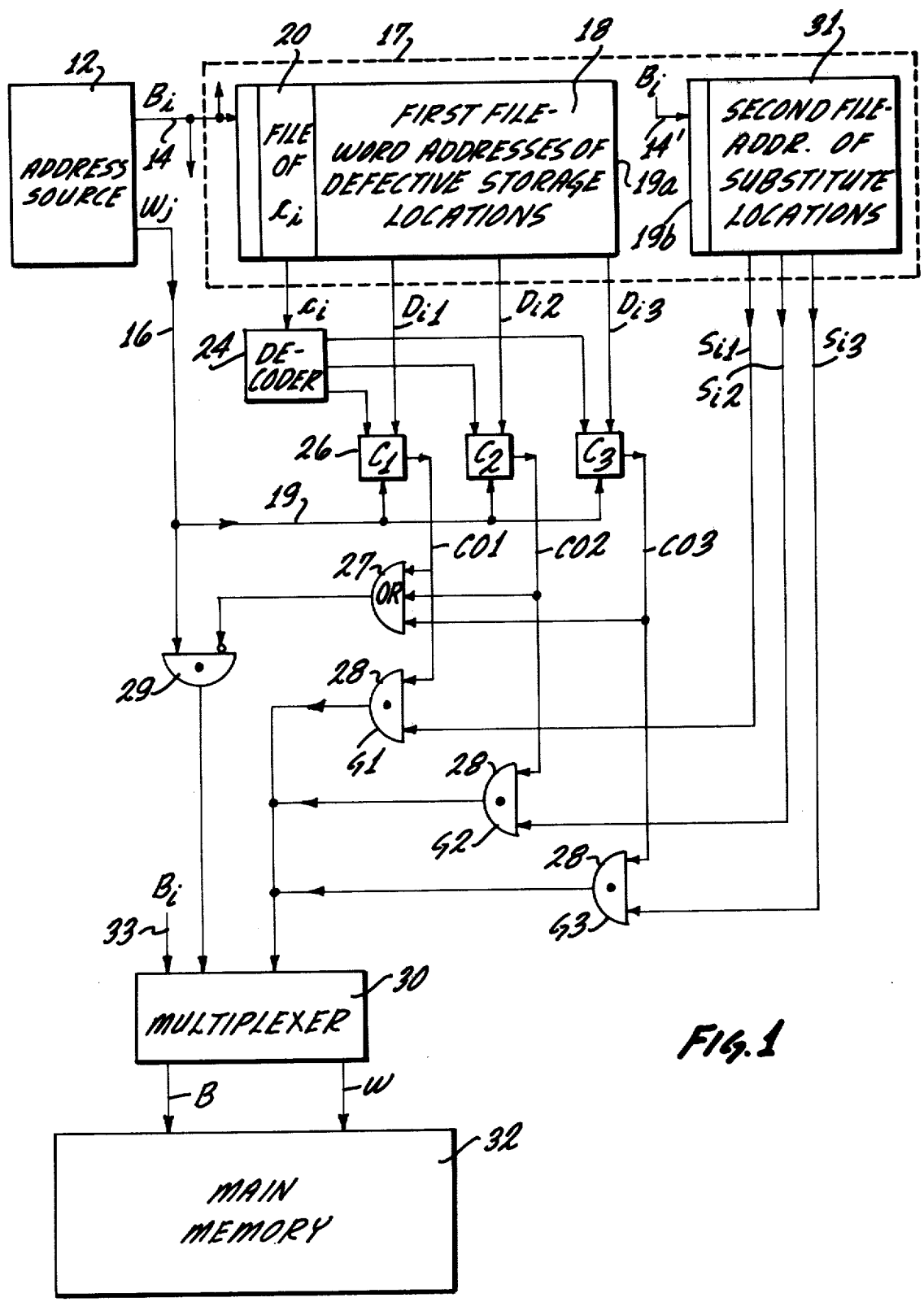
FIG. 1 is a block diagram of a preferred embodiment of the present invention utilizing an auxiliary memory having stored files of defective location addresses and substitute location addresses.

Turning first to FIG. 1, there is shown in block form, apparatus for providing substitute locations for those main memory locations that have been identified as being defective. An address source 12 generates addresses which designate locations in a main memory 32 which are to be accessed. While single lines have been used throughout the drawings for clarity, it is to be understood that a multistrand cable or bus, intended to transmit multiple signals in parallel, is encompassed.

Generally, the address includes a first part Bi, applied on the bus 14, containing the most significant bits of the address and uniquely identifying an increment or block of the main memory 32. In the present example of a 1 million word main memory divided into 1000 blocks of 1000 words each (actually 1024 blocks of 1024 words each), Bi can be understood to comprise ten bits which uniquely identify one of a thousand blocks. A second group of bits, a Wj group on the bus 16, corresponds to the least significant bits of the address which uniquely identify a specific word or location of the thousand words within a particular block. In the example, Wj comprises ten bits which uniquely identify one of the thousand words in a block.

In accordance with the present invention, there is provided an auxiliary memory 17, which is organized to furnish first address file 18 and a second address file 31. The first address file 18 is contained in a memory unit 19a and is addressed by the block address Bi applied on the bus 14. For each applied block address Bi, the first file 18 contains the addresses of any known defective storage locations Di1, Di2, Di3, within that block (but not more than three defective locations in the present example). The second address file 31 is contained in a second memory unit 19b and is also addressed by the block address Bi on the bus 14', and for each applied block address Bi, the file contains the addresses of substitute storage locations Si1, Si2, Si3, to be used respectively in placed of any defective locations Di1, Di2, Di3.

In addition, the auxiliary memory 17 further includes file 20 which in the present example is contained in memory unit 19a and is addressed by the applied block address Bi and contains the number ci of defective storage locations within each of the blocks Bi. In the present example, this information can be expressed in two bits. This is convenient because, in the embodiment of FIG. 1, it permits ci, Di1, Di2, and Di3 to be stored as a single 32-bit word presented by the auxiliary memory 17 in response to receipt of an applied block address Bi.

Figure 5:
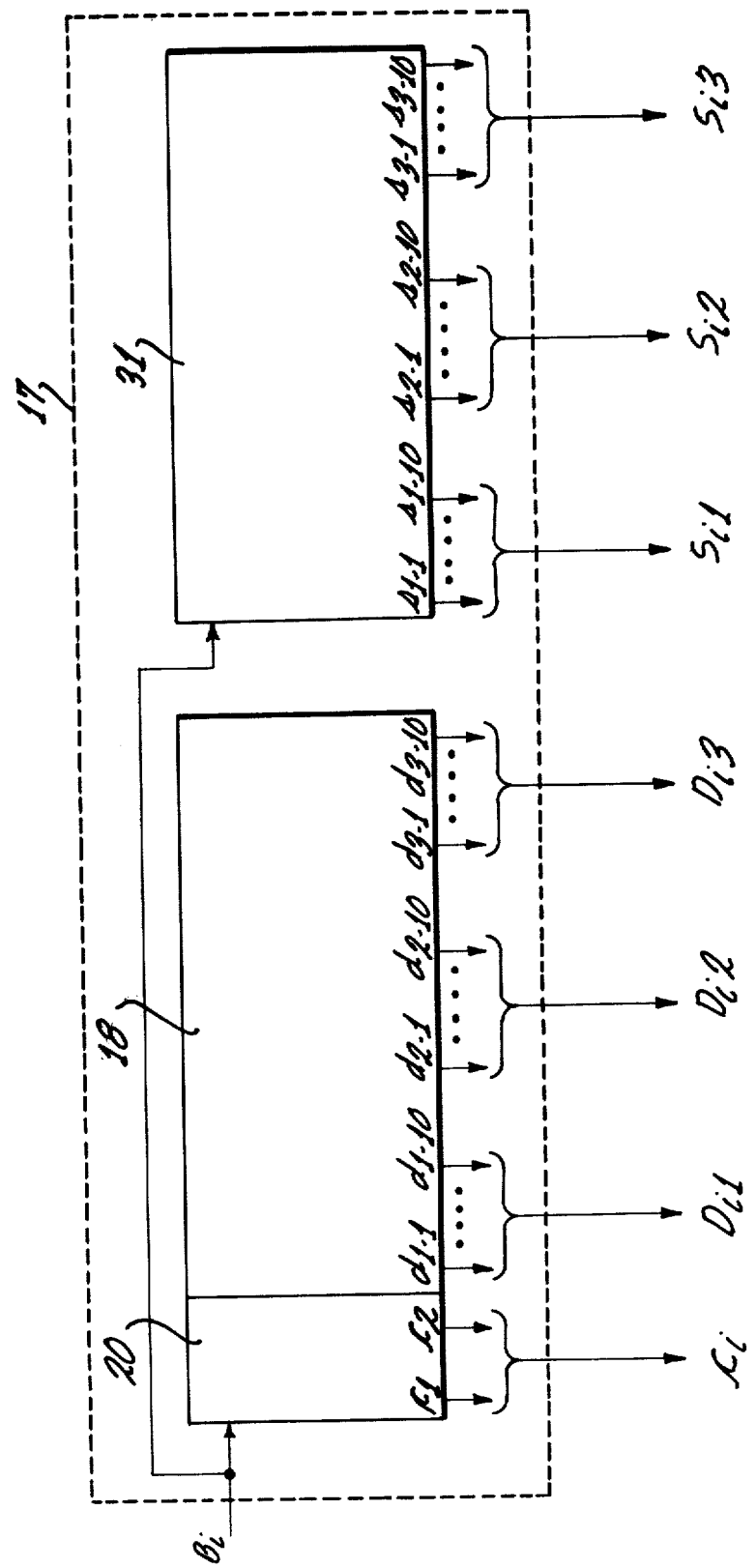
FIG. 5 is a block diagram illustrating the arrangement of the digits in the auxiliary memory in the preferred embodiment.

As illustrated in the more detailed depiction of auxiliary memory 17 of FIG. 1 which is shown in FIG. 5, the 32-bit word which is presented by auxiliary memory 17 may include two bits for ci (bits c1 and c2), and ten bits each for Di1, Di2, and Di3. As shown in FIG. 5, Si1, Si2, and Si3 may each also be represented by ten bits (for the embodiment of FIG. 1 in which the second address file is only required to provide the word address of the substitute location). It should be understood, however, that in certain other embodiments of the invention, the second address file may be required to provide a complete substitute location including both word address and block address and would then provide a greater number of bits (twenty bits for example) to represent the block and word address of each of the substitute locations Si1, Si2, Si3.

As noted above, for a thousand-word block, it is statistically unlikely that there would be more than three defective storage locations. However, the use of two bits should not be deemed a limitation to the generality of the concept and its applicability to blocks of significantly larger size, where more than three defective locations would be a real possibility.

As discussed, it is assumed that the acceptable number of defective locations within a block is limited to three. For very large, core memories of our experience, the identification of more than three locations containing defects within a block is a sufficiently rare occurrence to justify a rework of the memory to correct all defects or errors. For other types of memories, more than three defects per block may be acceptable, subject to some maximum number of permitted defects, in which case the number of number-representing bits in ci would be increased.

The number portion ci of each word is read out into a decoder 24 which preferably has one output line for each of the number of permissible defective locations. For the two bit ci of the illustrated embodiment, three output lines are provided. A plurality of comparator units 26 are provided, one for each of the possible defective locations whose address is stored in each word of the address file 18 (here, three comparators are shown, $C_1$, $C_2$ and $C_3$). For example, if "m" addresses are included in each word stored in the address file 18, then "m" comparators 26 would be provided, one for each of the stored addresses.

The Wj portion of the address is then simultaneously applied to all of the comparators 26 via the bus 19. However, the decoding network 24 only enables that number of comparators that corresponds to the applied number ci. For example, if the number "2" (binary 10) is stored as ci, then only the first two comparators $C_1$ and $C_2$ would be energized and the remaining comparator $C_3$ would be disabled.

The applied Wj portion of the address is then simultaneously compared in all of the comparators 26 with the applied defective addresses. If a comparison is found in any of the comparators C1, C2 or C3, then corresponding comparison signals CO1, CO2 or CO3 are generated by those comparators. Each comparison signal, representing a determination that a proposed address from the address source 12 is the same as the address of a location which has previously been identified as defective, is applied both to an OR circuit 27 which receives inputs from each of the comparators 26, and to the particular one of a group of substitute address multiple AND gates 28 designated G1, G2, G3, which is respectively associated with the comparator C1, C2 or C3 which found the comparison. The multiple AND gates G1, G2, G3 respectively receive (from the second file of memory 17) the corresponding substitute address Si1, Si2, Si3.

The output signal of the OR gate 27 forms an inhibit input to a word address multiple AND gate 29, which receives the Wj portion of the address from the address source 12 via the bus 16. If any of the comparators 26 has signaled a match, then an inhibit input is applied to the word address multiple AND gate 29 which then prevents the transmission therethrough of the signals of the Wj portion 16 of the applied address. The output of the gate 29 together with the outputs of the several substitute address AND gates 28 are applied to a multiplexer 30. An additional input to the multiplexer can be Bi, the block address portion of the applied address, which, in this embodiment, would be merely transmitted to the block address circuits of the main memory 32.

A second address file 31, here shown as contained in the separate memory unit 19b, receives the block portion Bi of the applied address, and a corresponding word from the second address file 31 is selected to be read out. The second address file 31 stores the addresses of substitute locations, which are otherwise unused locations in the main memory 32. The word corresponding to each applied block address need include only the same number of substitute locations as there are defective locations in the block Bi. That is, if only two locations within the block have been identified as defective, then only two substitute addresses need be stored in the second address file word corresponding to that block.

In the embodiment of FIG. 1, the substitute address identifies a location within the very same block Bi which is being addressed to by address source 12, and therefore only a substitute word address is stored since the block address is known a priori to be Bi. In response to receipt of the applied block address Bi, the second file 31 reads out the stored substitute addresses, denoted by Si1, Si2, and Si3 which are applied to gates G1, G2, G3 respectively. It will be remembered that in response to a successful comparison being made in one of the comparators C1, C2, C3 between the applied word address Wj and one of the defective word address location Di1, Di2, Di3, a corresponding comparison signal CO1, CO2, or CO3 is generated which is applied to a corresponding one of the gates G1, G2, G3 and acts as an enabling signal for that multiple AND gate to enable the passage therethrough of the corresponding one of the substitute location addresses Si1, Si2 or Si3. Thus of these substitute location addresses Si1, Si2, Si3, only the one corresponding to the successful comparison of a defective location with word address Wj will be passed by the multiple AND gates G1, G2 or G3 and applied to the multiplexer 30. In the absence of a signal from the comparator output OR gate 27, the address Wj will be applied to the multiplexer 30 through the AND gate 29. However, if a comparison signal is applied to enable one of the AND gates 28, then the incoming or applied word address Wj is inhibited and the corresponding substitute address is provided to the multiplexer 30 and through it to the word address receiving section of the main memory 32.

In the embodiment of FIG. 1, the Bi portion of the applied address is applied to the multiplexer 30 on the bus 33, and along with either the applied word address or the substitute word address defines a complete address in the main memory 32. This address accesses an available defect-free location. If the applied address location BiWj had been previously identified as defective, the second address file 31 provides a substitute word address location with no delay, and without the knowledge of the user of memory.

It should be noted that because of the correspondence established between the blocks of the main memory and the words of the auxiliary memory, only the block address Bi need be applied to auxiliary memory 17 to read out all possible defective locations in that block and all corresponding substitute locations. Because of this organization and because of the restriction on the number of defective locations in a block, memory 17 can be quite limited in size and storage capacity.

It should be further noted that in the embodiment of FIG. 1, the substitute locations are always in the same block as the defective locations they replace, thereby permitting the applied block address to be passed without change to the main memory and allowing the second file to be reduced in storage capacity since it only has to store substitute word addresses rather than complete substitute block and word addresses.

Figure 2:
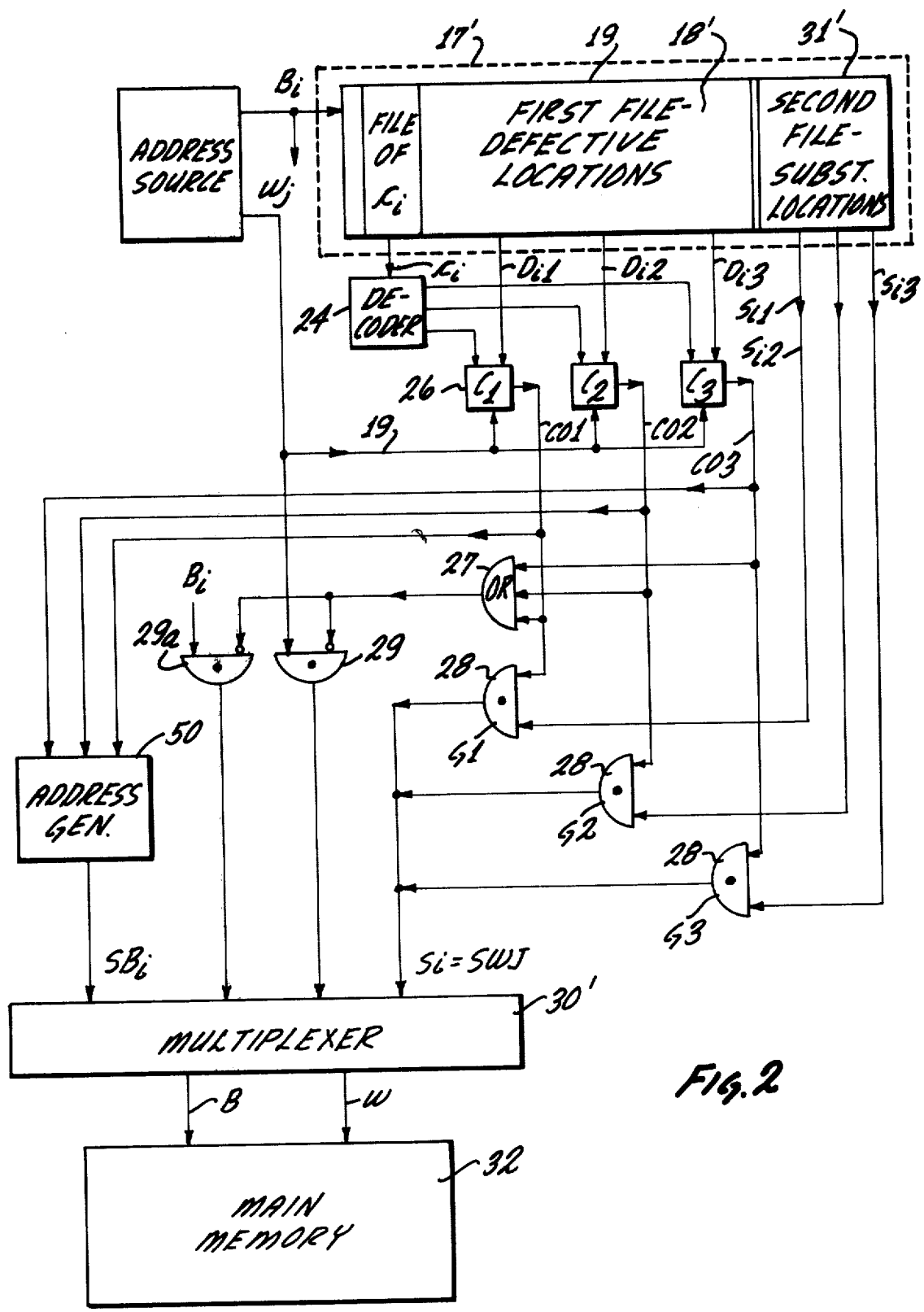
FIG. 2 is a block diagram of an alternative embodiment of the invention.

FIG. 2 shows a second embodiment of the present invention which differs slightly from the first embodiment of FIG. 1 in that the substitute locations are not necessarily in the same block as the defective locations they replace. As will be seen below, means are provided for generation of a substitute block address in addition to a substitute word address, the latter two addresses constituting the whole substitute address to be applied to the main memory. In FIG. 2, any one (or none) of the comparators 26 may supply an output to an address generator 50. The address generator 50 supplies a first substitute block address SBa when the $C_1$ comparator 26 provides the input signal, a second substitute block address SBb when comparator $C_2$ provides the input signal and a third substitute block address SBc when comparator $C_3$ provides the input signal. Thus, in this embodiment a particular substitute block address is associated with each of the comparators. Because the substitute block address is automatically established in this manner, only substitute word addresses need be stored in auxiliary memory 17' rather than complete substitute block and word addresses.

Referring again to FIG. 2, note that if a substitute block address is generated by generator 50 in response to a successful comparison signal CO1, CO2 or CO3, the same comparison signal which is applied to and through OR gate 27 will inhibit the passage of the applied word address Wj, through gate 29, to multiplexer 30' and will also inhibit the passage of the applied block address Bi through another multiple AND gate 29a to multiplexer 30'. Thus a successful comparison inhibits the application of the input block and word address to the multiplexer and enables the application of the substitute block and word address thereto.

In the embodiment of FIG. 2, the substitute addresses are by way of example included in the same "word" with the defective addresses in a single unitary memory unit 19, so that the single input block address Bi accesses both the defective addresses in a first address file 18' and the substitute addresses in a second file 31' of memory unit 19 of auxiliary memory 17'.

As can be seen, most of the structure of FIG. 2 is similar to that shown in FIG. 1. The several block address outputs of the block address generator are applied to a multiplexer 30' whose output is either the whole applied address BiWj or a substitute address SBiSWj. The block part of the substitute address is generated by the address generator 50, while the word part of the substitute address is generated as in FIG. 1.

Figure 3:
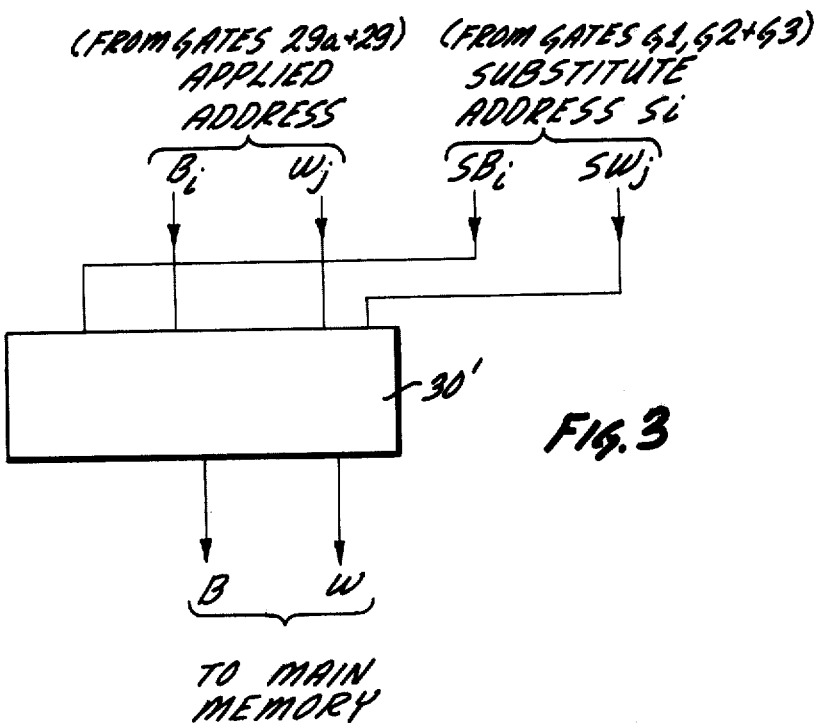
FIG. 3 is a block diagram of the multiplexer of a portion of a modified alternative embodiment, in which a complete substitute address including both block address and word address is provided by the substitute location file of the auxiliary memory.

In connection with FIG. 3, an alternative embodiment is described which is identical to that of FIG. 2 except that it is assumed that the substitute address Si stored in the second file 31' of auxiliary memory 17' includes both a block address portion SBi and a word address portion SWj, and accordingly address generator 50 is removed since it is no longer needed. Gates 29a and 29 function as in FIG. 2 to pass or inhibit the passage of the applied block and word address Bi and Wj to multiplexer 30′. Gates G1, G2 and G3 function as before to pass or inhibit substitute addresses Si1, Si2 or Si3 under the control of comparison signals CO1, CO2 and CO3 respectively. However, any substitute address Si which is passed now includes both block address SBi and word address SWj, both of which are applied to multiplexer 30′. In the case of a recognized defective location, the composite address BW includes the SBi and SWj digits of the substitute address, and neither the Bi nor Wj portions of the applied address are used. On the other hand, when none of the comparators 26 signals a comparison, the applied address BiWj is passed to the main memory as the BW address.

In this embodiment, assume that the address supplied by the address source is for Block 17, Word 350, which is a defective location and is the second defective location in Block 17. Accordingly, the address for Word 350 may be found as a second part of the word stored in Word 17 of the first address file 18′ and will be presented by memory 17′ as the defective location address Di2. Further, assume that Block 20, Word 200 has been assigned as the substitute location. The address for Block 20, Word 200 is then stored in the second portion of Word 17 in the second address file 31′ and will be presented by auxiliary memory 17′ as substitute location address Si2.

As the comparisons are made, the second, $C_2$ comparator, 26 signals a match and gates the address for Block 20, Word 200 through the gate G2 into the multiplexer 30′. The presence of a logic high signal from the comparator "OR" gate 27 blocks the passage of both the Bi and Wj addresses from the Address Source 12 through the gates 29a and 29 to multiplexer 30′ and hence only the address for Block 20, Word 200 is transmitted through multiplexer 30′ to the main memory 32.

Thus, there has been shown several alternative embodiments of a method and apparatus for better utilizing large memories containing some defects. Where spare locations are available within the block containing the defective locations, the block address can be supplied directly to the main memory and a substitute address is supplied for the address of each defective word in the block. In this embodiment, an error in Block 6, Word 17 would result in the utilization of a predetermined word, for example, Word 1,005 of Block 6 as the substitute word whose address is supplied to the main memory.

In a second embodiment, special blocks are dedicated to hold spare words. For example, Block 1001 could hold all of the substitute words corresponding to the first defective words of the blocks. Block 1002 and Block 1003, respectively store the substitute word corresponding to the second and third defective words of the blocks. Here address generators can be energized by the output of a corresponding comparator and both the applied block and word addresses are suppressed.

In yet another embodiment, requiring a somewhat larger, second address file, the complete Block and Word address of a substitute word is stored for each stored address of a defective word location. Here the multiplexer provides either the original applied Block and Word address or a Block and Word address which is stored in the second address file. In this third embodiment, the substitute locations may be located in any of the blocks.

Variations of the concept include the provision of a stored code indicating the number of defective addresses actually stored in each word of the address file. The stored code is then utilized to limit the number of comparators employed in the comparison step.

Figure 4:
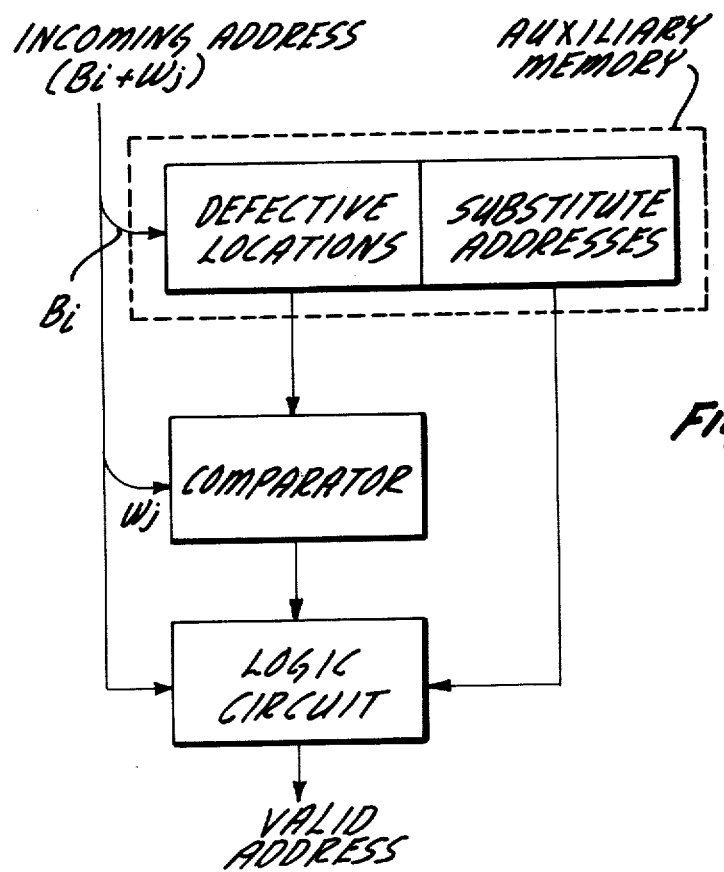
FIG. 4 is a block diagram generic to all of the embodiments.

As shown in the generic drawing of FIG. 4, the present invention involves using the block address portion Bi of an incoming address to access an auxiliary memory in which for each block the corresponding word addresses of known defective storage locations of a main memory are stored along with associated addresses of known good substitute storage locations of the main memory. The word addresses of the defective locations are read into a comparator where they are compared with the incoming word address. When the incoming word address is not found among the defective addresses, the incoming address is passed to the main memory. When the incoming address is found to be defective, a substitute address is applied to the main memory in lieu of the incoming address. In either case the address applied to the main memory is valid in the sense that it is not the address of a known defective storage location.

Other variations will appear to those skilled in the art according to the teachings of the present invention. Therefore, the scope of the invention should be limited only by the claims appended hereto.

What we claim is:

1. In an addressable main memory organized in blocks containing words, each main memory word being addressable by a corresponding main memory address having a block address portion and word address portion, apparatus for supplying substitute addresses to be used in place of addresses of defective main memory words, said apparatus comprising:

auxiliary memory means for storing a plurality of information packets respectively corresponding to blocks of the main memory, said auxiliary memory means being operable for having each packet selectively readable therefrom in response to application thereto of the respectively corresponding main memory block address alone, said auxiliary memory being so operable without any application thereto of the corresponding main memory word address, each information packet containing the word addresses of the words within the corresponding main memory block containing defects and also containing respectively associated substitute addresses;

comparator means coupled to said auxiliary memory means for receiving the defective word addresses of an information packet read therefrom, and signalling any match between the applied main memory word address and the same defective word address contained in said information packet means for applying a desired main memory address having a block address portion and a word address portion with the block address thereof being applied to said auxiliary memory means and the word address being applied to the said comparator means;

gating means coupled to said auxiliary memory means for receiving substitute addresses read therefrom and to said comparator means, said gating means being responsive to the signalling of a match by said comparator means for furnishing to the main memory, the corresponding substitute address contained in the information packet;

whereby the word address portion of an applied main memory address is compared with the stored word addresses of all defective locations within the same block and, if the applied address is found to be for a defective word, a substitute address is furnished.

2. The combination of claim 1, above wherein said auxiliary memory means include a first auxiliary memory unit for storing addresses of defective words and a second auxiliary memory unit for storing addresses of substitute words, each information packet including a group of word addresses stored in said first auxiliary memory unit and also including a group of substitute addresses, respectively corresponding to the addresses stored in said first auxiliary memory, stored in said second auxiliary memory unit.

3. The combination of claim 1, above wherein said information packet includes a stored number corresponding to the determined number of defective word addresses in said packet, said comparator means further including enabling means operable in response to the stored number for limiting comparisons of said applied word address, said applied word address being compared against only the determined number of defective word addresses to signal any match therebetween.

4. The combination of claim 1, above wherein the substitute addresses stored in each information packet are word addresses alone without block address portions.

5. In an addressable memory organized in "N" increments of "M" storage locations per increment each storage location being addressable for read out by application to said memory of a memory address having an increment defining portion capable of selectively addressing "N" increments, and a location defining portion capable of addressing to "M" storage location, auxiliary apparatus for avoiding the use of addressed storage locations having defects or errors therein, comprising in combination:

address file means having at least "N" first storage elements, each capable of storing up to a predetermined number of storage location addresses, each stored storage location address being associated with a main memory storage location having an error or defect therein and at least "N" second storage elements, each corresponding to a first storage element and each capable of storing up to said predetermined number of substitute addresses, each substitute address having a counterpart stored address in the corresponding first storage element, each substitute address being associated with and representative of a "spare" storage location in the main memory said address file means being responsive to application thereto of the increment defining portion alone of a memory address for reading out corresponding first and second storage elements;

comparator means having a first input coupled to said address file means, and an output terminal, said comparator means being coupled to receive the different stored addresses from a read out first storage element of said address file means, said comparator means having a second input adapted to receive an applied memory address storage location address of said comparator means being operable to signal a match between a stored address and a supplied address;

enabling means coupling said comparator match signalling output to control the output of said corresponding second storage element of said address file means;

whereby an applied memory address for a location within an increment of the main memory is compared to all of the addresses of locations within that increment containing defects or errors, and a comparator match, signalling that the applied address is for a memory storage location having errors or defects, enables the provision of a substitute address from said second storage element to be used in accessing the memory in place of the applied address.

6. The combination of claim 5 wherein said first storage elements comprise a first auxiliary memory unit and said second storage elements comprise a second auxiliary memory unit, said first auxiliary memory unit being coupled to said comparator means first input and said enabling means being operable to control the output of said second auxiliary memory unit.

7. The combination of claim 5, above wherein said comparator means include the predetermined number of comparator elements, each adapted to receive a different address from a selected first storage element and each element being coupled to said enabling means to control the counterpart stored address.

8. The apparatus of claim 5 further including multiplexing apparatus coupled to the source of addresses, said address file means and said comparator means and operable in response to match representing, comparator output signals for transmitting to the memory a stored substitute address in place of an applied address.

9. The apparatus of claim 7 wherein said address file means further include in each first storage element, additional, number representing bits, for signalling how many addresses are stored in each first storage element; and disabling means coupled to said comparator means for disabling all but the number of comparator elements corresponding to the stored number.

10. In an addressable memory as set forth in claim 8 above in which spare storage locations are provided in each increment, the apparatus of claim 8 wherein said multiplexing apparatus is coupled to receive only that portion of an applied address representing the location within an increment, and wherein the source of addresses applies an increment address to the memory and said multiplexing means supplies the storage location address.

11. In an addressable memory as set forth in claim 8 above, in which the memory contains spare increments in which all substitute addresses are to be found, the apparatus of claim 8 above, wherein said multiplexing apparatus is coupled to receive only that portion of an applied address representing the location within an increment and said multiplexing means supplies the address of the storage location to the memory, but not the increment address, said apparatus further including address generating means for providing an increment address to the memory.

12. The addressable memory of claim 11, above wherein said address generating means are coupled to said comparator means, each comparator element output causing the generation of a different increment address.

13. The method of utilizing a memory having a plurality of addressable storage locations, each storage location being addressable with application of a corresponding memory address having a gross increment address portion and a fine increment address portion, some of the storage locations being considered spare or alternative locations, the memory being organized in gross increments each containing fine increments, the memory including a first address file portion for storing addresses of those fine increments of the memory which include errors or defects, and a second address file portion for storing addresses of those spare locations which can be used for information storage, comprising the steps of:

(a) applying an address to the memory;
(b) comparing for identity, only the fine increment address portions of the applied address with the contents of the first address file portion whose address is the applied gross increment address portion;
  (i) accessing the storage location of the memory corresponding to the applied address if the increment portion of such address is not identical to any of the addresses stored in said first address file portion; or
  (ii) selecting a substitute address from said second address file portion associated with the particular address stored in said first address file portion that is identical to the applied fine increment address portion; and
  (iii) accessing an alternative memory location corresponding to the address selected from said second address file portion.

14. The method of claim 13 above wherein the comparing step includes the step of simultaneously applying the applied fine increment address portion to each of a plurality of comparators and simultaneously applying to the comparators, each of the fine increment addresses stored in the first address file portion identified by the gross address portion.

15. The method of claim 13 above in which the first address file portions additionally store with each group of stored addresses a code combination representing how many addresses are in the group, the further step of:
enabling that number of comparators represented by the code combination, for limiting comparisons to addresses actually stored.

16. In an addressable main memory organized in blocks containing words, each main memory word being addressable by a corresponding main block address and word address, an auxiliary memory for supplying substitute addresses to be used in place of addresses of defective main memory words comprising:

(a) address file means having a plurality of first words respectively corresponding to blocks of the main memory, said address file means having each first word selectively readable therefrom in response to application to said address file means of the respectively corresponding main memory block address alone and without any requirement for application thereto of the corresponding main memory word address, each first word of said address file means being adapted to store a plurality of word addresses of words containing defects within the corresponding main memory block, and having a plurality of second words respectively corresponding to the first words and the corresponding blocks of the main memory, each second word being selectively readable from said address file means in response to application thereto of the respectively corresponding main memory block address alone, each second word being adapted to store a substitute address for each word address stored in the corresponding first word;

(b) comparator means coupled to said first address file means for receiving a first word read therefrom, said comparator means including at least one comparator element for signalling a match between an applied main memory word address and a matching word address contained in said first word;

(c) means for applying a desired main memory address to said auxiliary memory with the block address being applied to said address file means to read the corresponding first and second words therefrom and the word address being applied to the said comparator means; and (d) gating means coupled to said address file means for receiving a second word read therefrom and to said comparator elements, said gating means being responsive to the signalling of a match by a comparator element for furnishing to the main memory the corresponding substitute address contained in the second word, whereby the word address of an applied main memory block is compared with the stored word addresses of all defective locations within the block and, if the applied main memory word address is found to be defective, a substitute main memory word address is furnished.

17. The auxiliary memory of claim 16 wherein the plurality of word addresses stored in each first word is a predetermined number of such word addresses.

18. The auxiliary memory of claim 17 wherein the said predetermined number of word addresses is three.

19. The auxiliary memory of claim 16 wherein said comparator means includes a plurality of comparator elements respectively corresponding to the word addresses stored in the first word of said address file means, each one of said plurality of comparator elements being operable for signalling any match between the corresponding word address and the applied main memory word address.

20. The auxiliary memory of claim 19 wherein all of said plurality of comparator elements are operable substantially simultaneously for signalling matches between their respectively corresponding word addresses and the applied main memory word addresses.

21. The apparatus of claim 4, above including address generating means for generating substitute block address information to supplement stored substitute word addresses for providing to the main memory a complete, substitute block and word address in place of an applied block and word address corresponding to a defective word.

22. The combination of claim 21 above wherein each information packet contains a predetermined maximum number of word addresses of defective words within the corresponding main memory block.

* * * * *